United States Patent [19]

Yu

[11] 4,419,636
[45] Dec. 6, 1983

[54] LOW FREQUENCY WIDE BAND SIGNAL COUPLER

[76] Inventor: Hong Yu, 2 Parrish Hill Dr., Nashua, N.H. 03063

[21] Appl. No.: 313,770

[22] Filed: Oct. 22, 1981

[51] Int. Cl.³ .............................................. H03H 7/48
[52] U.S. Cl. ...................................... 333/131; 333/100
[58] Field of Search .............. 333/100, 112, 118, 119, 333/124, 131

[56] References Cited

U.S. PATENT DOCUMENTS 3,559,110  1/1971  Wiley et al. ........................ 333/112
3,747,028  7/1973  Pennypacker ...................... 333/112

*Primary Examiner*—Paul L. Gensler
*Attorney, Agent, or Firm*—Wolf, Greenfield & Sacks

[57] ABSTRACT

One circuit is a low frequency, wide band multi-directional tap that exhibits good match characteristics with low through loss. The circuit has input and output terminals conductively interconnected, a tap output terminal, an inductive winding having $n_1/n_2$ series turns and a series resistor coupling from the tap on the inductive winding to the tap output terminal. The other circuit is a low frequency, wide band multi-directional signal splitter that also exhibits good match characteristics with low through loss. The circuit has an input terminal and two output terminals interconnected by three core transformers each having an isolation resistor associated therewith.

6 Claims, 6 Drawing Figures

LOW FREQUENCY WIDE BAND SIGNAL COUPLER

BACKGROUND AND SUMMARY OF THE INVENTION

The present invention relates in general to low frequency wide band signal couplers. More particularly, the invention herein discloses a low frequency wide band multi-directional tap circuit, and in another embodiment a low frequency, wide band multi-directional signal splitter. These circuits have use in CATV and related applications.

Presently, for CATV applications coupler devices are used for interconnecting a main signal line with a subscriber. However, such devices have directionality limitations and generally only permit signal communication from a central control unit to the subscriber.

Accordingly, it is an object of the present invention to provide a signal coupler preferably for CATV applications and wherein signal communication is permitted in multiple directions with no such directionality limitation referred to hereinbefore. In this way communication can occur, not only from the central unit to the subscriber, but also between subscribers. In this regard it is understood that the subscriber can take on many forms including a work station, word processor, or even some form of mechanical robot that is to be controlled.

Previously, conventional resistive directional couplers might have been contemplated for such applications. However, these devices are too lossy.

Accordingly, another object of the present invention is to provide an improved low frequency wide band coupler that has low through loss and also that is matched. The signal coupler of the present invention is usable at frequency ranges of 1 KHz to 900 MHz, however, the preferred operating range is 0.01–5.0 MHz.

A further object of the present invention is to provide a low frequency wide band multi-directional signal coupler that is of extremely simple construction, that has very good electrical characteristics, and that can be manufactured relatively inexpensively.

Still another object of the present invention is to provide a low frequency wide band signal coupler that may be embodied either as a tap circuit or as a signal splitter both versions of which exhibit multi-directional signal characteristics.

To accomplish the foregoing and other objects of this invention there is provided a low frequency, wide band signal coupler which is described herein in two different versions. In accordance with one version of the present invention, this is meant for connection from a main communication line to a subscriber. The second version may be more appropriately identified as a signal splitter for splitting a signal from a main line to separate lines to be coupled to two separate groups of subscribers. In accordance with the first embodiment of the invention the coupler comprises an input terminal for receiving an input signal which is in the frequency range of 1 KHz to 900 MHz, and an output terminal. Conductive electrical means intercouple the input and output terminals enabling signal coupling from the input to the output. The signal coupler also comprises an inductive winding having N turns and coupled from the conductive electrical means. There is also provided a tap output terminal. This signal coupler may be referred to as a tap or tap circuit. Finally, there is provided a signal tap node from the inductive winding taken at a location along the winding separating the N turn winding into $n_1$ and $n_2$ turns where $n_1/n_2$ is greater than zero. Means intercouple the signal tap node and the tap output terminal including a resistor means. In the disclosed embodiment this resistor is a 62 ohm resistor. The conductive electrical means may comprise a direct wire connection between input and output terminals. There is also preferably provided a core upon which the winding is wound. This device is particularly meant for use with coax cable input and output connections.

In accordance with the other version of the present invention which is in the form of a signal splitter, this low frequency, wide band device comprises an input terminal for receiving an input signal in the frequency range of 1 KHz to 900 MHz. More particularly the frequency range may be 0.01–5.0 MHz. The coupler also includes a first output terminal and a second output terminal. The signal at the input terminal splits to the two output terminals. The circuit includes three transformers each having a pair of windings including a first and a second winding. Means couple the input and first and second output terminals to first windings of the respective three transformers. Means also couple the three second windings in a series circuit. Also included are three isolation resistors and means coupling the isolation resistors each respectively across one of the second windings. Each of the transformers preferably comprise a core upon which the pair of windings is wound. There is also included conductive electrical means intercoupling the first and second windings of each transformer at an intermediate point of their ends. The isolation resistors are preferably of a value on the order of twice the coaxial cable impedance. These resistors in the disclosed embodiment are in the range of 130–150 ohms.

BRIEF DESCRIPTION OF THE DRAWINGS

Numerous other objects, features and advantages of the invention should now become apparent upon a reading of the following detailed description taken in conjunction with the accompanying drawings, in which.

DETAILED DESCRIPTION

It is desired in accordance with the present invention to provide a device that has all of the desirable performance parameters of a conventional CATV directional tap, such as good match and low loss and yet avoid the limitations on directionality that are inherent in these conventional taps. One may contemplate the use of conventional resistive devices such as a directional coupler. However, these are too lossy.

The device of the present invention is adapted for operation over a frequency range of 1 KHz to 900 MHz. However, the preferred frequency range of operation is usually 0.1 MHz to 5.0 MHz.

Figure 1:
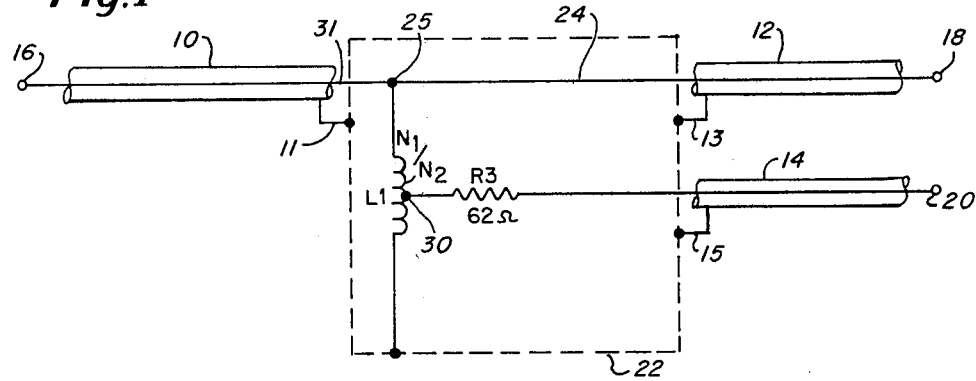
FIG. 1 is a circuit diagram of the first signal coupler of this invention.

FIG. 1 shows the preferred version of the circuit of the present invention shown with coaxial input and output connections including an input coax line 10 and two output coax lines 12 and 14. There is an input terminal 16 and also an output terminal 18. In addition there is provided the tap output terminal 20. The metal case 22 for containing this circuit is shown by the dotted outline. Within this metallic case is the winding L1 which is preferably wound upon a core (not shown). A direct electrical connecting lead 24 couples directly between input and output; namely from the input coax 10 to the output coax 12. The winding L1 couples from the node 25 to the case 22 which is considered as ground. It is also noted that the shields of the coax connect to the case at 11, 13 and 15. Also included in the circuit is a resistor R3 which connects from a signal tap node 30 to the tap output terminal 20 by way of the coax 14. Actually, although the input and output terminals have been shown at the end of a piece of coax, from the standpoint of the device itself, these inputs and outputs are taken directly at the case. For example, the input to the device is taken at point 31 shown in FIG. 1.

Figure 2:
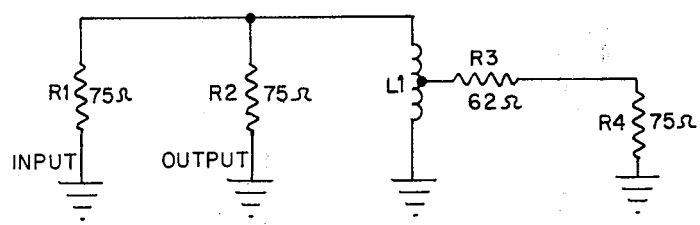
FIGS. 2 and 3 show equivalent circuits for the circuit shown in FIG. 1.
Figure 3:
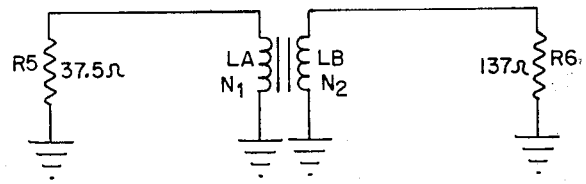

FIGS. 2 and 3 show the equivalent circuit when fully terminated in a 75 ohm coaxial cable. Resistor R1 in FIG. 2 depicts the input impedance. Resistor R2 in FIG. 2 depicts the output impedance. In FIG. 3 the resistor R5 it is noted is one-half of the ohmage of resistor R1 and represents the parallel combination of resistors R1 and R2. In FIG. 2 the winding is shown as winding L1 and resistor R3 is also shown. The resistor R4 represents the tap impedance. In FIG. 3 the resistor R6 is a combination of resistors R3 and R4 having the value of 137 ohms as noted. The equivalent circuit of FIG. 3 shows the winding or inductor L1 separated into windings LA and LB of respective turns $n_1$ and $n_2$.

By way of example, let it be assumed that $n_1/n_2=2$. The total energy absorbed at the tap is the power ratio of its impedance loading. The formula is:

$$\text{Energy} = R5/(R6(n_1/n_2)^2)$$
$$= 37.5/137(4)$$
$$= 0.0684$$

The theoretical through loss will thus be:

$$1-0.0684=0.9316.$$

The dB equivalent ratio is then:

$$10 \log (0.0684) = -11.6 \text{ dB}$$

In actuality, however, measurements show that the dB equivalent ratio is:

$$-12 \text{ dB}.$$

The through dB loss is given by the following expression:

$$10 \log (0.9316) = -0.3 \text{ dB}$$

The actual loss has been found to be:

$$= -0.6 \text{ dB}$$

By way of another example let it be assumed that the ratio $n_1/n_2 = 13/5$ or 2.6. The tap loss is given by the following expression:

$$10 \log (37.5/137 \times (2.6)^2 = -13.9 \text{ dB}$$

The actual loss is measured at $-14$ dB.

The through loss is given by the following expression:

$$10 \log (1-375/137 \times (2.6)^2) = -0.2 \text{ dB}.$$

The actual loss has been measured at $-0.5$ dB.

The additional losses as represented by actual measurements taken are mainly due to the inefficiencies and losses in the circuit having to do with the windings including core loss and physical constraints such as stray parasitic capacitance.

Figure 4:
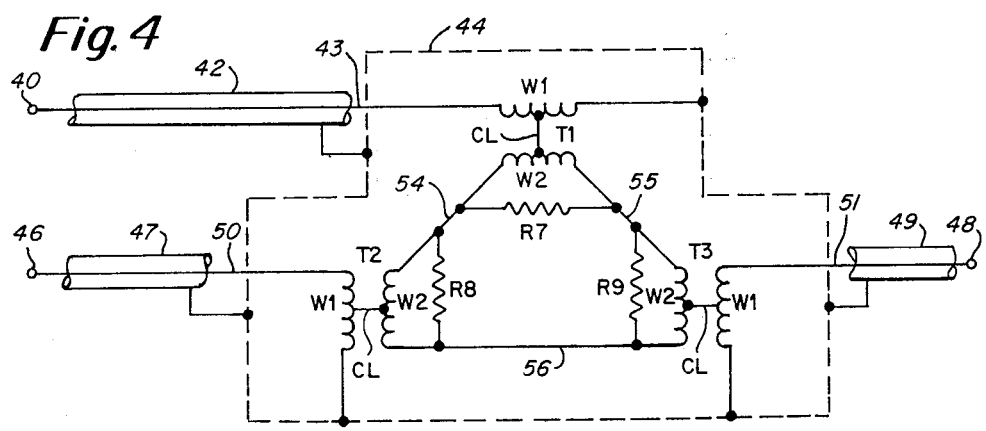
FIG. 4 is a circuit diagram of the second embodiment of the present invention employed as a signal splitter.

FIG. 4 shows the second embodiment described herein. It is intended that this device also be operated with the same VSWR requirements and at substantially the same frequency range as described in connection with the first embodiment. The embodiment of FIG. 4 may be referred to as a signal splitter. This device has low split loss, is matched and permits multi-directional communication. Although the device in FIG. 4 has been labeled as to input and outputs, it is understood that this device is adapted for use so that signal communication can occur from input to output or from output to input and also between outputs as labeled in FIG. 4.

Thus, in FIG. 4 there is shown an input terminal 40 and associated input coax line 42 coupled to an input 43 of the device. As with the first embodiment the device is shown in a case 44 indicated by the dotted outline. There are two outputs, one at output terminal 46 and the other at output terminal 48. These output terminals have associated therewith respective coax lines 47 and 49. The outputs from the device itself are taken at points 50 and 51 associated respectively with the coax lines 47 and 49.

The device itself comprises three transformers T1, T2 and T3. Each of these are core transformers with there being a direct electrical connection between the two windings thereof. In FIG. 4 each transformer is shown as including a winding W1 and a winding W2 having a direct electrical connection lead CL coupled therebetween. All of the windings W2 are connected in a series circuit by means of the conductors 54, 55 and 56. There are also provided isolation resistors R7, R8 and R9 coupled respectively across each of the windings W2.

It is preferred to have each transformer comprise a core upon which the pair of windings is wound. However, in an alternate arrangement, there can be provided two cores and an associated single winding.

Figure 5:
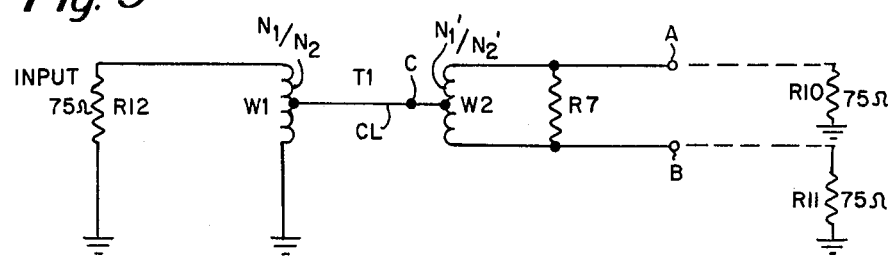
FIG. 5 is an equivalent circuit associated with the detailed circuit of FIG. 4.

FIG. 5 is an equivalent circuit for a portion of the splitter of FIG. 4. More particularly, this is the equivalent circuit associated with the transformer T1. The equivalent circuit shows a resistor R12 representative of the input impedance of the 75 ohm line. The impedance matching transformer T1 is shown with its windings W1 in series with resistor R12 and with an isolation resistor R7 across the winding W2. As with the first embodiment the taps off of the respective windings W1 and W2 for connection of the lead CL is selected in a predetermined ratio to be described hereinafter. This is represented by the ratio in the drawing of FIG. 3 of $n_1/n_2$. Points A and B are representative of outputs for the section of the overall circuit considered in FIG. 5.

The impedance at point C in FIG. 5 is 37.5 ohms when the ratio $n_1'/n_2' = 1/1$. The output splits equally or at $-3.0$ dB theoretical value. The reflected impedance at the input, when $n_1n_2=7/5$ is then by given by the following expression:

$$37.5 (7/5)^2 = 73.5 \text{ ohms}$$

This is as close to actuality as can be reasonably and practically expected.

The theoretical ratio is 1.414. Hence, the unit is very closely matched.

Assuming that all energy is coupled through to points A and B, the power loss at each port will then be given by the expression:

$$10 \log (\tfrac{1}{2}) = -3 \text{ dB}$$

The power loss expressed above is also true when the signal is returned from points A or B to the input. Therefore, this device may be used as either a splitter or combiner. Again, this illustrates the multi-directional characteristics of this device.

The device shown in FIG. 4 may be considered to be a bi-directional device in that signals are capable of travelling back and forth between either point A and the input or point B and the input, with reference to the equivalent circuit of FIG. 5.

Although the circuit of FIG. 5, which shows only a portion of the overall circuit of FIG. 4, is bi-directional, it is not multi-directional because in order to achieve good matching, an isolation resistor, in the case of FIG. 5, resistor R7, is used of a value twice the output impedance value which is needed. With the output impedance of 75 ohms this resistor is selected at 150 ohms. This resistor prevents the signal travelling for leaking) from point A to point B directly.

However, when essentially three of such circuits, as depicted in FIG. 5 are used as in the complete embodiment of FIG. 4, the signal will be able to travel very freely between any of the three main ports of the device at points 43, 50 and 51 as illustrated.

In FIG. 4 all ports are matched to 75 ohms when terminated. The through loss among these ports will thus be equal to:

$$(-3 \text{ dB}) + (-3 \text{ dB}) = -6.0 \text{ dB}$$

The actual loss has been measured at $-6.1$ dB when employing the aforementioned 150 ohm isolation resistor. These are shown in FIG. 4 as resistors R7, R8 and R9. In practice, there has also been employed a 130 ohm isolator resistor, thereby reducing the through loss to $-6.0$ dB. This is close to the theoretical value and still maintains a good match.

In the circuit of FIG. 4 there are three transformers T1, T2 and T3 that are provided. The windings in the transformers are arranged with the coupling leads CL so as to provide proper match. For example, the transformer may have winding W1 with a turns ratio of $n_1/n_2 = 21/15$. The winding W2 may have a turns ratio $n_2'/n_2' = 1/1$.

Figure 6:
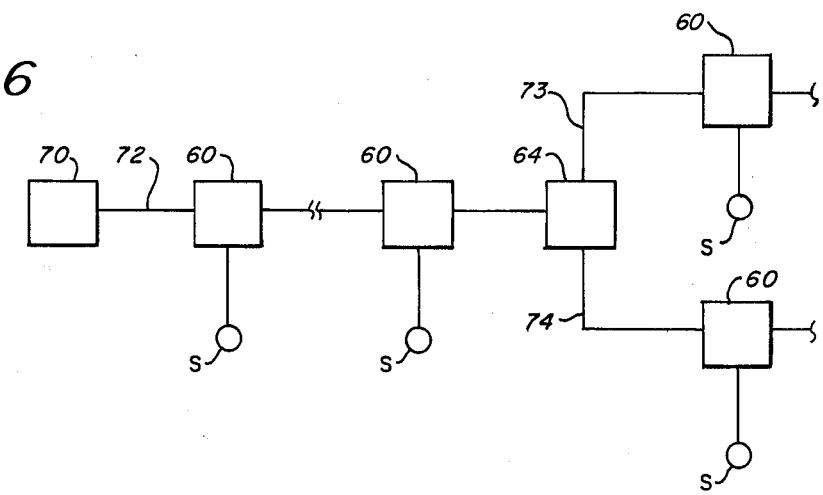
FIG. 6 is a schematic block diagram showing the use of these circuits in a system application.

FIG. 6 illustrates a schematic diagram having a central control unit 70 from which the signals are generated. It is noted that these signals couple on a main line 72 to a series of devices 60. These are tap devices such as in the circuit of FIG. 1. The main line may also couple to a second device 64 which is a splitter device such as shown in the embodiment of the present invention in detail in FIG. 4. The main line is thus split into two separate lines 73 and 74 with each of these lines in turn coupling to further ones of the devices 60 of FIG. 1. Also shown in FIG. 6 are the connections to each of the subscriber units S.

Having described a limited number of embodiments of the present invention it should now be apparent to those skilled in the art that numerous other embodiments are contemplated as falling within the scope of this invention.

What is claimed is:
1. A low frequency, wide band signal coupler comprising;
   an input terminal for receiving an input signal in the frequency range of 1 KHz to 900 MHz,
   a first output terminal,
   a second output terminal,
   three transformers each having a pair of windings including a first and second winding,
   means coupling the input and first and second output terminals to respective first windings of the respective three transformers,
   means coupling the three second windings in a series circuit,
   three isolation resistors,
   and means coupling the isolation resistors each respectively across one of said second windings.
2. A signal coupler as set forth in claim 1 wherein the frequency range is 0.01–5.0 MHz.
3. A signal coupler as set forth in claim 1 including conductive electrical means intercoupling the first and second windings of each transformer at an intermediate point of their ends.
4. A signal coupler as set forth in claim 1 using coaxial cable input and output connections.
5. A signal coupler as set forth in claim 4 wherein the isolation resistors are of a value on the order of twice the coaxial cable impedance.
6. A signal coupler as set forth in claim 5 wherein the isolation resistors are each on the order of 150 ohms.

* * * * *